(12) United States Patent
Carinci et al.

(10) Patent No.: US 10,416,261 B2
(45) Date of Patent: Sep. 17, 2019

(54) METHOD AND APPARATUS FOR RECORDING MAGNETIC RESONANCE DATA

(71) Applicant: Siemens Healthcare GmbH, Erlangen (DE)

(72) Inventors: Flavio Carinci, Erlangen (DE); Dominik Paul, Bubenreuth (DE)

(73) Assignee: Siemens Healthcare GmbH, Erlangen (DE)

( * ) Notice: Subject to any disclaimer, the term of this patent is extended or adjusted under 35 U.S.C. 154(b) by 254 days.

(21) Appl. No.: 15/456,838

(22) Filed: Mar. 13, 2017

(65) Prior Publication Data
US 2017/0261587 A1   Sep. 14, 2017

(30) Foreign Application Priority Data
Mar. 14, 2016  (DE) .................. 10 2016 204 146

(51) Int. Cl.
  *G01V 3/00* (2006.01)
  *G01R 33/56* (2006.01)
  *G01R 33/54* (2006.01)
(52) U.S. Cl.
  CPC ....... *G01R 33/5607* (2013.01); *G01R 33/543* (2013.01); *G01R 33/5602* (2013.01); *G01R 33/5608* (2013.01)

(58) Field of Classification Search
  USPC .......................................... 324/309
  See application file for complete search history.

(56) References Cited

U.S. PATENT DOCUMENTS

| | | | |
|---|---|---|---|
| 2010/0264920 A1* | 10/2010 | Witschey | G01R 33/5605 324/309 |
| 2013/0088226 A1* | 4/2013 | Miyazaki | G01R 33/5607 324/309 |
| 2015/0268317 A1 | 9/2015 | Blumhagen et al. | |
| 2016/0069976 A1 | 3/2016 | Kickhefel et al. | |

* cited by examiner

*Primary Examiner* — Rodney E Fuller
(74) *Attorney, Agent, or Firm* — Schiff Hardin LLP

(57) ABSTRACT

In a method and apparatus for recording magnetic resonance (MR) data of a target region of a subject, the recording process is divided into subsections each follow the other after a repetition time. Before each recording of MR data of a subsection with a measurement sequence, an adiabatic preparatory pulse is activated that inverts the longitudinal magnetization of a saturation molecule type, from which no MR data are to be recorded. An excitation pulse is emitted spaced by an inversion time from the preparatory pulse. Before the first preparatory pulse, at least one adiabatic preparation pulse is emitted that inverts the longitudinal magnetization with a timing such that the longitudinal magnetization of the saturation molecule type at the time of the first preparatory pulse at a steady state value, which occurs again before the repetition time after each preparatory pulse.

11 Claims, 3 Drawing Sheets

METHOD AND APPARATUS FOR RECORDING MAGNETIC RESONANCE DATA

BACKGROUND OF THE INVENTION

Field of the Invention

The invention concerns a method for recording magnetic resonance data of a target region of an examination object, in particular of a patient, with a magnetic resonance scanner, of the type wherein the recording process is divided into a number of successive subsections that occur after a repetition time in each case, and wherein, before each recording of magnetic resonance data of a subsection with a measurement sequence, an adiabatic preparatory pulse is radiated that inverts the longitudinal magnetization of a saturation molecule type, from which no magnetic resonance data are to be recorded, and at least one excitation pulse of the measurement sequence is thereafter radiated, spaced from the preparatory pulse by an inversion time. The invention also concerns a magnetic resonance apparatus, and a non-transitory, electronically readable data storage medium that implement such a method.

Description of the Prior Art

Saturation methods, in particular for fat saturation, are known within the framework of magnetic resonance imaging. In particular "spectral attenuated inversion recovery" (SPAIR) has also been proposed, which is based on the inversion of the longitudinal magnetization within a frequency band of the magnetic resonance spectrum. An adiabatic preparatory pulse inverting the longitudinal magnetization is omitted. The excitation pulse of the actual measurement sequence should then ideally be radiated at a time after a so-called inversion time, such that the longitudinal magnetization of the saturation molecule type, of which the magnetic resonance signal is to be suppressed, is null where possible. As mentioned, fat saturation is a frequent application for the SPAIR technique.

If the preparatory pulse (frequently also referred to as the inversion pulse) is repeated multiple times, for example during multislice imaging or segmented k-space sampling, there is usually a repetition time between two preparatory pulses. If this repetition time is in the range of the longitudinal relaxation time T1 of the spectrally inverted magnetization, the optimum inversion time TI initially continues to change as the measuring time progresses, since the first preparatory pulse is based on the maximum possible, i.e. completely relaxed, longitudinal maximum magnetization, but because of the complete relaxation not yet being produced after the expiration of the repetition time, the optimum inversion time T1 will no longer be reached. This means that, for a constant choice of the inversion time for all repetitions, the magnetic resonance signal of the saturation molecule type, i.e. in the inverted frequency band, will oscillate in the first repetitions, until a steady state is achieved. Thus a signal inconsistency is present between the different repetitions. In the case of fat saturation, this effect will result in image artifacts or fat signal inhomogeneities in the magnetic resonance image data set.

In order to solve this problem, it has been proposed to emit a spectrally selective preparation pulse be output before the first time that the preparatory pulse is emitted, which partly saturates the longitudinal magnetization in the frequency band of interest, i.e. for the saturation molecule type, and allows the steady state to be reached without multiple repetitions. In this case the magnetic resonance signal that is recorded in the first repetitions can be used for the imaging, wherein artifacts are greatly reduced. Such a method is described, for example, in DE 10 2014 204 995 A1.

The use of a spectrally selective preparation pulse also has disadvantages, however, because the spectral effectivity of the preparation pulse does not correspond to that of the preparatory pulse, and the preparation pulse is not adiabatic. For these reasons restrictions of the spectral and spatial effectiveness of the preparatory pulse occur when the steady state is being reached.

SUMMARY OF THE INVENTION

An object of the present invention is to provide improved and reliable establishment of the steady state in the above-described context, before the time of the first repetition.

This object is achieved by a method of the type described at the outset but wherein, in accordance with the invention, before the time of the first application of the preparatory pulse, at least one adiabatic preparation pulse, that inverts the longitudinal magnetization, is emitted in a time sequence describing the time intervals between the pulses, such that the longitudinal magnetization of the saturation molecule type sets itself to a steady state value at the time of the radiation of the first preparatory pulse, which is again radiate before the repetition time after the radiation of each preparatory pulse.

The basis of the invention is thus the use of at least one adiabatic radio-frequency pulse as a preparation pulse, which ultimately can be selected as identical to the preparatory pulses that are used for the inversion. This allows the steady state to be established without the need for multiple repetitions and with an improved spatial and spectral homogeneity. The idea in this case is skillfully to select the time intervals in the time sequence so that the steady state value of the longitudinal magnetization, which ensues in the steady state after expiry of the repetition after application of a preparatory pulse, is produced. When the preparatory pulse is now emitted, this occurs directly in the steady state. In this case, as already mentioned, the at least one preparation pulse can expediently be chosen identical to the preparatory pulse, thus in particular as a SPAIR pulse. In this case it is important that the preparation pulses are adiabatic and their effect corresponds to that of the preparatory pulse, namely that the longitudinal magnetization will be inverted in a selected frequency band, which covers the resonant frequencies of the saturation molecule type. The at least one preparation pulse (which can also be referred to as the preparation block) naturally only has to be emitted a single time, namely before the time of the first repetition.

As noted, the tuning or matching of the times of the at least one preparation pulse and the preparatory pulse, described by at least one time interval, is important for the success of the inventive method. In this case, the at least one time interval of the time sequence can be determined by the use of a look-up table and/or a functional mathematical relationship, which is or are established empirically, and/or by calculation as a function of the basic magnetic field strength, the relaxation time of the saturation molecule type, and the repetition time. The necessary time intervals are thus essentially determined by the relaxation behaviors in the frequency band to be inverted, described by the T1 relaxation time of the saturation molecule type, the strength of the basic magnetic field (B0), and the repetition time TR chosen for the recording process. While it is fundamentally possible to describe the relaxation behavior within the framework of a simulation or even analytically in at least some cases, and to derive the suitable time intervals therefrom, it is also possible to acquire suitable time intervals for different repetition times and basic magnetic field strengths and also relaxation behaviors empirically, thus using measurement techniques. For a specific magnetic resonance scanner, the strength of the basic magnetic field usually remains the same and usually a specific type of saturation is to be achieved, for example a fat saturation, in which the saturation molecule type is fat molecules. Therefore, for that scanner, the fundamental dependence of the time intervals for an actual magnetic resonance device is given by the selected repetition time.

In such cases, two embodiments of operation are conceivable, wherein in one alternative the method operates with one preparation pulse, in the other alternative it operates with two preparation pulses.

Thus in a first embodiment of the present invention, a single preparation pulse is emitted at a time spaced before the first preparatory pulse by a first time interval of the time sequence. This first time interval is selected so that, at the time that the preparatory pulse is emitted, the longitudinal magnetization of the saturation molecule type reaches the steady state by relaxation. Thus, at a point in time that is predetermined by a first (here single) time interval, an adiabatic preparation pulse, which inverts the magnetization in the selected frequency band, is emitted before the time of the first preparatory pulse. Thereafter in the method a wait occurs until such time as the longitudinal magnetization of the saturation molecule type has set itself to the steady state value, before the first repetition begins and consequently the steady state is produced. The first time interval is thus produced directly here from the relaxation behavior of the saturation molecule type. In this case it should be noted that the optimum first time interval consequently increases with longer repetition times, so that this method is especially advantageous with short repetition times, when the steady state value is not located too close to the maximum possible magnetization in the basic magnetic field after complete relaxation.

In the alternate embodiment of the present invention using two preparation pulses, the respective radiation of two preparation pulses are spaced apart by a second time interval, and the first preparatory pulse follows a third time interval after the radiation of the second preparation pulse. The second time interval is selected so that, through relaxation, the negative of an intermediate value of the longitudinal magnetization ensues. Starting from this intermediate value after the second preparation pulse has been radiated, the steady state value of the longitudinal magnetization of the saturation molecule type is achieved through relaxation during the third time interval. The idea here is ultimately to "shorten" the path to the steady state value of the longitudinal magnetization, by the longitudinal magnetization of the saturation molecule type, after it has passed the negative of the steady state value, again being inverted and then, after short relaxation, it will already reach the steady state value. Conversely stated, with this method of operation the minimum possible third time interval, in particular fixed, is selected that is predominantly produced from the duration of a preparation pulse and if necessary spoiler gradients to be emitted. Thus in the present example, the second time interval is modified between the first and the second preparation pulse as a function of the repetition time, wherein the third time interval between the second preparation pulse and the preparatory pulse is selected as short as possible and fixed, in order to minimize the overall period of time of the time sequence of the preparation scheme. Since for steady state values that lie close to the maximum possible value of the longitudinal magnetization in the basic magnetic field, the point in time of the second inversion can be selected earlier, the result is that in this case the optimum second time interval grows with shorter repetition times, thus a reverse behavior compared to the first alternative is produced. It has been shown that a number of application cases with the second described alternative of two preparation pulses can be realized for shorter overall durations of the time sequence, so that this variant is preferred in accordance with the invention.

However, it should be noted with respect to the second variant that restrictions to the area of use exist, or longer overall periods of time can occur. This is because the period of the second preparation pulse, which for example can be between 20 and 40 ms and is predetermined, i.e. invariable, is also included as a further variable to be considered in the time sequence. This means that, at least with a fixed third time interval, a maximum repetition time exists, which means the alternative with two preparation pulses is no longer able to be used. Moreover, the reversed behavior in relation to the repetition time means that situations exist in which the first alternative is more favorable in terms of time than the second alternative. These are cases in which, during the course of the repetition time, the longitudinal magnetization of the saturation molecule type never entirely reaches the null value, so that a lower applicability results in practice, but nonetheless this case should still be taken into consideration.

In a further embodiment of the present invention, therefore, at least in a predetermined scanner in which both the first alternative and also the second alternative are able to be used, depending on the repetition time, either the method in accordance with the first alternative or the method in accordance with the second alternative is selected such that the overall duration covered by the time sequence is minimal. This is based on the fact that, in areas in which the second variant is no longer able to be used at least when constantly keeping the third time interval to a minimum, the first variant has a shorter overall duration of the time sequence. Thus, depending on the selected repetition time, one of the two described variants can be selected, thus either one or two preparation pulses is/are emitted. It has been shown that for the first alternative, the optimum time interval increases approximately linearly with the repetition time, while for the variant, when the third time interval is kept constant, the second time interval decreasing with respect to a threshold value, above which the second alternative, at least when the third time interval is kept constant, can no longer be used. Should the repetition time be selected so that the period of time for the first variant is shorter than for the second variant, as explained, the first variant is to be chosen.

It should again be noted that when, because of the conditions, the second alternative with the use of two preparation pulses can no longer be used for a specific higher repetition time (the threshold value), an entirely different preparation scheme can be used above this threshold value. For example, the preparation scheme described in the introduction can be used, which uses a non-adiabatic, spectrally selective preparation pulse. More detailed information about this scheme is provided by the aforementioned DE 10 2014 204 995 A1.

In another embodiment of the invention, a spoiler gradient pulse to clear remaining transverse magnetization is activated after each preparation pulse. The spoiler gradient pulse is used for dephasing with respect to the transverse magnetization, so that remaining transverse magnetizations will ultimately be erased and cannot negatively influence the imaging.

As noted, the preparatory pulse and the at least one preparation pulse preferably are SPAIR pulses. Furthermore the described method can be used to particular advantage when the saturation molecule type is fat molecules.

As well as the method, the invention concerns a magnetic resonance apparatus, having a control computer configured to operate the data acquisition scanner of the apparatus in order to implement the inventive method. The control computer has as a sequence controller, which controls the actual recording of the magnetic resonance data. The control computer also has a preparation processor, in which the time sequence for the at least one preparation pulse is determined and the preparation pulses are inserted in accordance with the overall magnetic resonance sequence, so they can be emitted before the time of the first repetition by the sequence controller. All information relating to the inventive method is applicable to the inventive magnetic resonance apparatus, and the same advantages are obtained.

The present invention also encompasses a non-transitory, computer-readable data storage medium encoded with programming instructions that, when the storage medium is loaded into a computer system of a magnetic resonance apparatus, cause the computer to operate the magnetic resonance apparatus in order to implement any or all embodiments of the method according to the invention as described above.

DESCRIPTION OF THE PREFERRED EMBODIMENTS

Shown below are exemplary embodiments of the inventive method relating to a suppression of magnetic resonance signals of fat molecules as molecule type (fat saturation); the present method is however also basically able to be applied to other saturation molecule types, for example silicon. In the present example SPAIR pulses are used as preparatory pulses, which for a frequency band, in which resonant frequencies of the saturation molecule type are contained, inverts the longitudinal magnetization (180° pulse), and are adiabatic. Adiabatic pulses essentially offer the greatest combined immunity to B1 inhomogeneities and resonance offsets.

Figure 1:
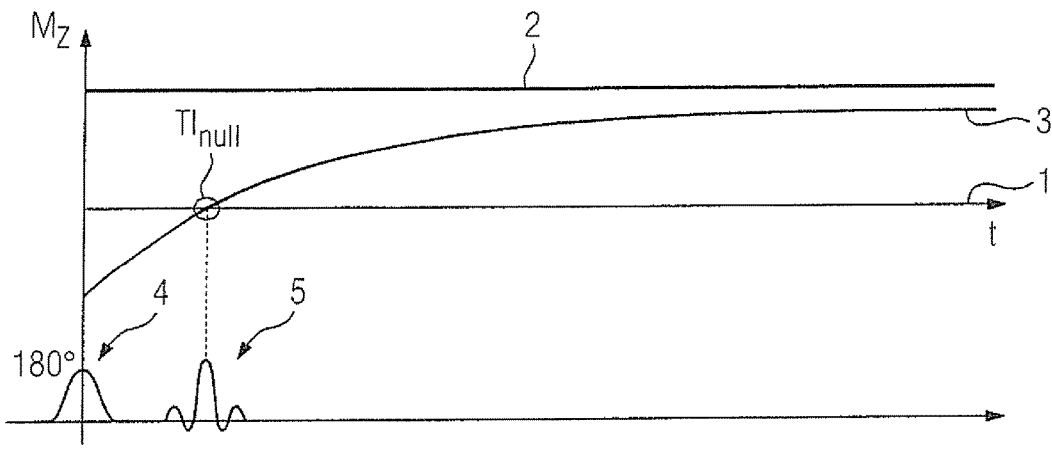
FIG. 1 schematically illustrates the principle of suppressing magnetic resonance signals of a saturation molecule type

FIG. 1 shows a diagram of the basic way in which this type of suppression of fat signals functions. Shown in relation to a time axis 1 are the magnetization curve 2 of water, the magnetization curve 3 of fat and also radiofrequency pulses used. The SPAIR pulse is initially provided as preparatory pulse 4, which is clearly shown to actually rotate the longitudinal magnetization of the fat molecules by 180° into the negative. The longitudinal magnetization of the fat molecules then begins, in accordance with the magnetization curve 3 to relax in the direction of the maximum possible, original magnetization (maximum magnetization), which is possible in the basic magnetic field. As precisely as possible to the time of the zero crossing of the magnetization curve 3, after the so-called inversion time TI, the molecules not saturated in this way, here the water molecules, are excited, via the excitation pulse 5 of a following measurement sequence not shown in greater detail here.

In many application cases the measurement sequence will not just be performed once, but repeatedly, for example during the recording of different measurement slices of a stack of slices or during segment-by-segment sampling of k-space. Then a fixed inversion time TI, which is valid for the steady state, is usually started and a preparatory pulse is emitted before each execution of the measurement sequence. In this way the preparatory pulse 4 is repeated after a repetition time in each case. If the recording of the magnetic resonance data is now begun without any preparation, the first preparatory pulse acts on the maximum possible longitudinal magnetization of the fat molecules in the basic magnetic field. It takes a long time, however, because of the long relaxation time T1 for fats, until this is reached again. The repetition time usually is within the T1 for fats. Therefore, during the next emission of the preparatory pulse 4, the magnetization has not yet returned again to its maximum possible value, so that, after the inverting, there is accordingly also relaxation from another value, which finally leads to a type of transient process, which then ends by the relaxation process for a following preparatory pulse 4 again ending precisely at the longitudinal magnetization on which the preceding preparatory pulse 4 has acted. This value of the longitudinal magnetization will be called the steady state value below. An optimum image data quality is thus reached when the steady state value of the longitudinal magnetization is already in existence at the time of the emission of the first preparatory pulse 4 for the fat molecules. This will be achieved in the inventive method.

Figure 2:
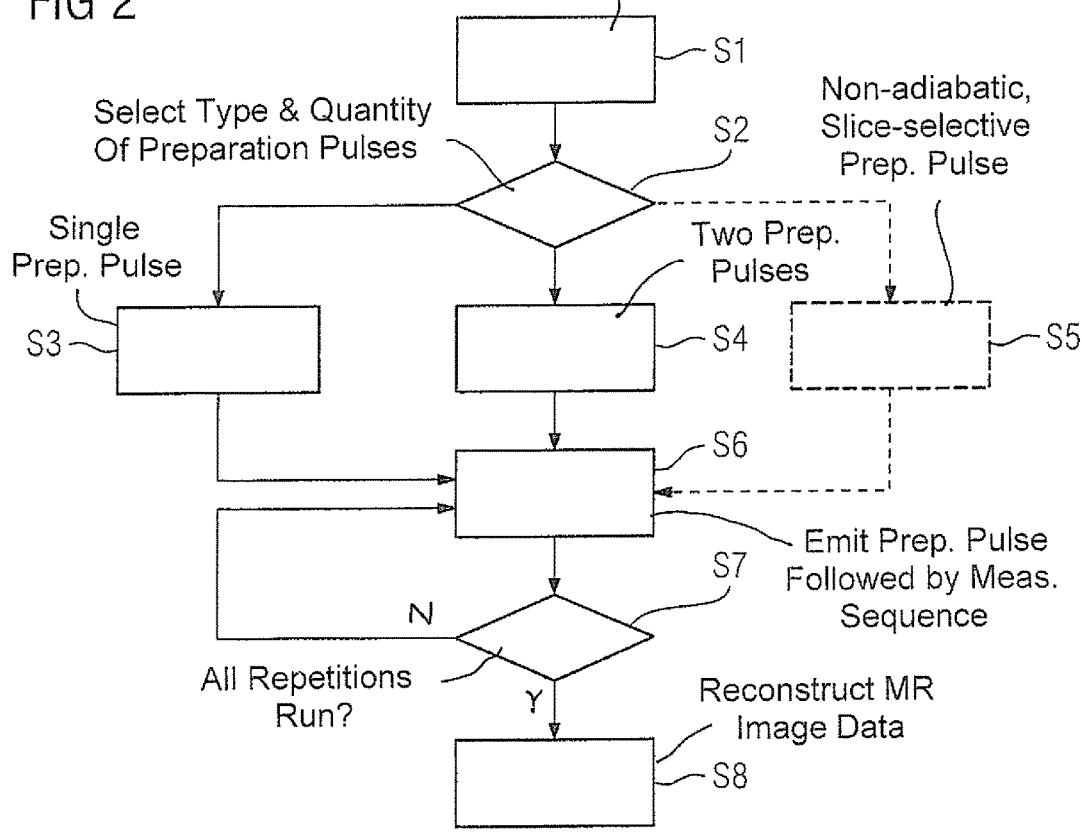
FIG. 2 is a flowchart of the inventive method.

An exemplary embodiment of the inventive method for recording magnetic resonance data of a target area of an examination object, here of a patient, is shown schematically in the flowchart of FIG. 2.

In this flowchart, in a step S1, the recording parameters for the entire magnetic resonance sequence for recording the magnetic resonance data are present, wherein the magnetic resonance sequence, as has already been described, is divided into subsections, in which a part of the magnetic resonance data will be recorded in each case with a measurement sequence after application of a preparatory pulse 4. These recording parameters include the repetition time TR.

This will be used in a step S2 in order to determine the type and quantity of preparation pulses, which will be output in a time sequence, which ends with time of the output of the first preparatory pulse 4 before the first application of a preparatory pulse 4. The two conceivable alternatives for using inverting, adiabatic preparation pulses, in particular SPAIR pulses once again, will now be explained in greater detail in respect of FIGS. 3 and 4.

Figure 3:
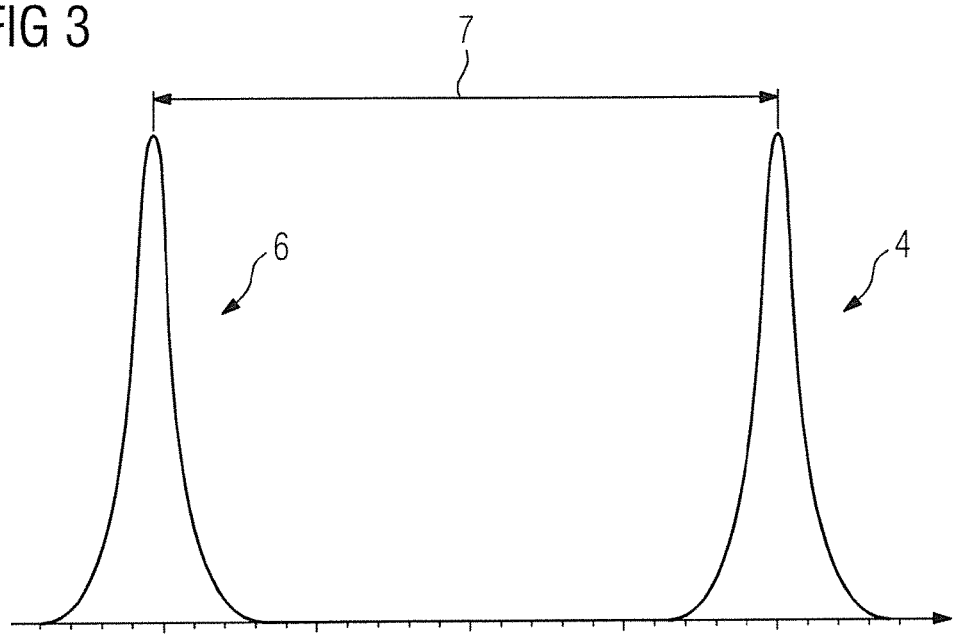
FIG. 3 shows a first alternative of a preparation scheme.

FIG. 3 shows a first time sequence, wherein a single inverting adiabatic preparation pulse 6 is used. The time sequence is described here merely by a single, first time interval 7, which lies between the emission of the preparation pulse 6 and time of the first preparatory pulse 4. In this case the first time interval 7 is selected so that the longitudinal magnetization inverted by the preparation pulse 6 from the maximum possible value of the longitudinal magnetization in the basic magnetic field exactly reaches the desired steady state value at the time of the emission of the temporally first preparatory pulse 4.

Figure 4:
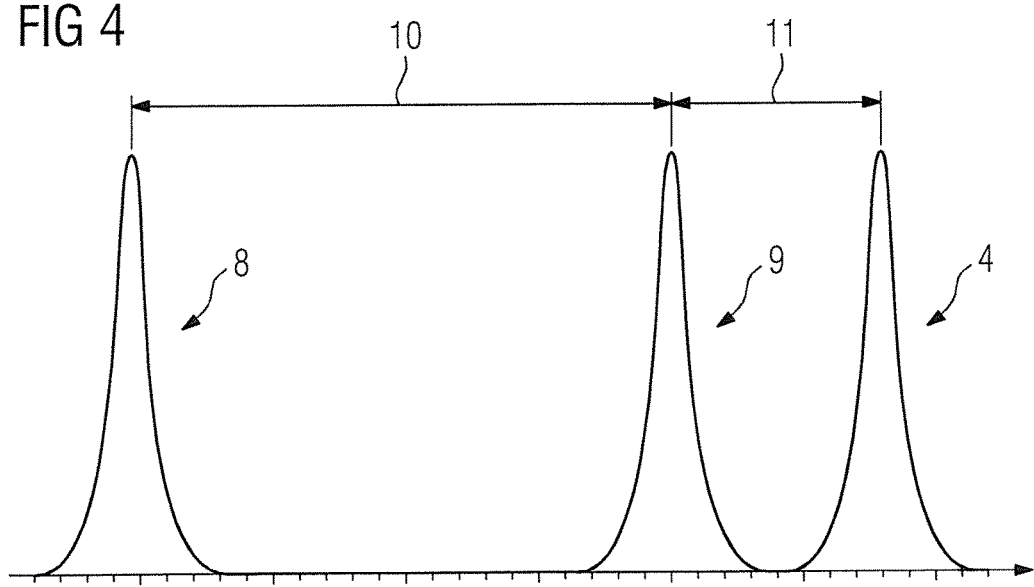
FIG. 4 shows a second alternative of a preparation scheme.

FIG. 4 shows a further time sequence of a second alternative, wherein here two inverting, adiabatic preparation pulses 8, 9 are used. The first preparation pulse 8 and the second preparation pulse 9 are spaced apart from one another in time in this case by a second time interval 10, the second preparation pulse 9 and the temporally first preparatory pulse 4 by a third time interval 11. The sum of the second time interval 10 and the third time interval 11 in this case produces the overall duration of the time sequence. There is provision in the present case for the third time interval 11 to be kept fixed to the minimum possible value.

Thus, in this second alternative in accordance with FIG. 4, the longitudinal magnetization of the fat molecules will initially be inverted by the first preparation pulse 8 from the maximum possible value, which corresponds to complete relaxation, and the relaxation begins. However in the present example there is a shortening by the second preparation pulse 9, since as soon as the longitudinal magnetization has dropped to a value slightly lower in terms of amount than the steady state value, the longitudinal magnetization will be rotated once again so that it is sufficient as further relaxation, in the third time interval 11, for the longitudinal magnetization to relax from the intermediate value to the steady state value.

For the first alternative in accordance with FIG. 3 it is thus accurate to say that the overall duration of the time sequence increases with the repetition time TR. A reverse behavior is, however, the case in the second variant in accordance with FIG. 4, since there the total period of the time sequence decreases with the repetition time, up to (at least initially with a fixed, minimum third time interval 11) a threshold repetition time $TR_{max}$.

Figure 5:
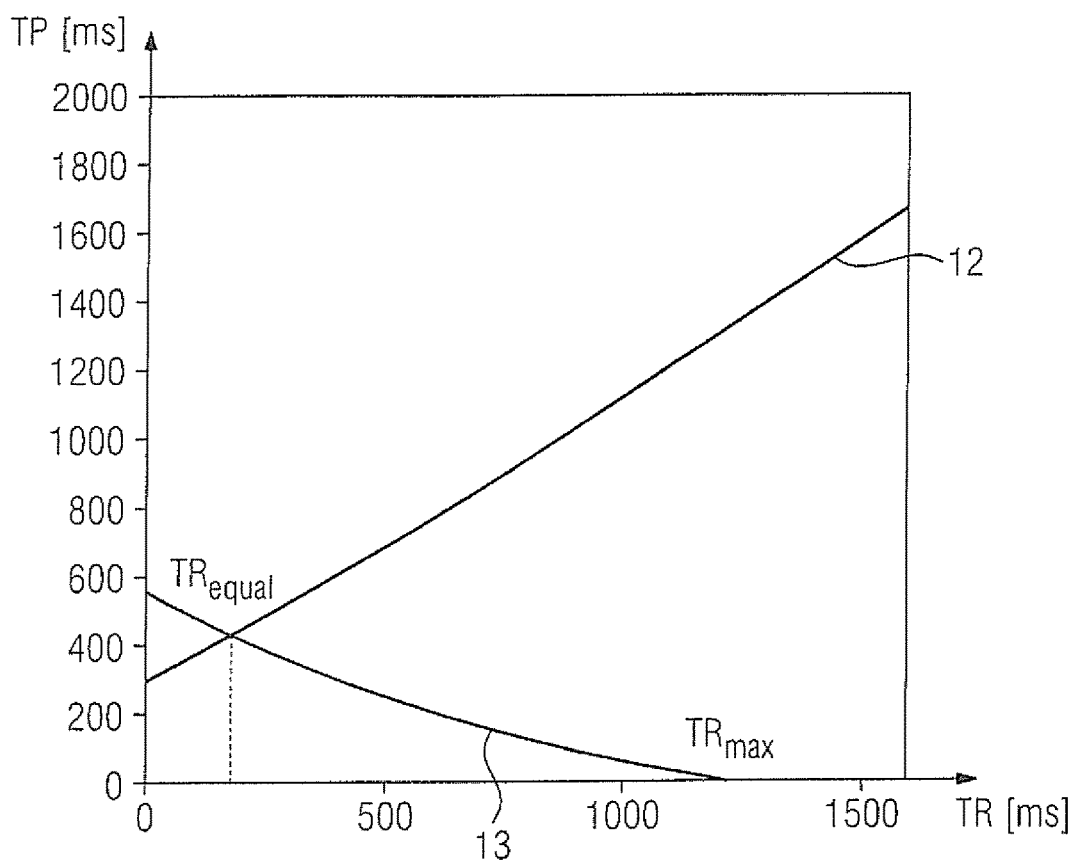
FIG. 5 shows possible curves of overall durations of the time sequences in accordance with FIG. 3 and FIG. 4.

Examples of dependencies of the total period TP of the time sequence on the repetition time TR are shown in FIG. 5. Basically of course there is also a dependency on the strength of the basic magnetic field and the relaxation behavior of the saturation molecule type, here fats, which in the present example however can be assumed to be constant for a specific magnetic resonance device.

The functional mathematical relationship shown in FIG. 5 or a corresponding look-up table, which can be stored in each case in a control device of the magnetic resonance device used, are able to established both by measurements and also, where necessary by way of expansion, by calculations.

As can be seen from FIG. 5, the curve 12 assigned to the first variant with only a single preparation pulse 6 rises in an approximately linear manner. The curve 13 assigned to the second variant with two preparation pulses 8, 9 falls until the repetition time $TR_{max}$. The curves intersect at a repetition time $TR_{equal}$.

The relationship from FIG. 5 is now able to be used to select in step S3 whether the first variant or the second variant will be used, wherein it has been shown that the second variant is sufficient for most practical application cases. For repetition times that are smaller than $TR_{equal}$, the preparation scheme according to alternative 1 with a single preparation pulse 6 will be used, for repetition times that are larger than $TR_{equal}$, the second variant with two preparation pulses 8, 9 will be employed. This is illustrated in FIG. 2 by the steps S3 (use of only a single preparation pulse 6) and S4 (use of two preparation pulses 8, 9). It should also be pointed out that optionally, for values of the repetition time that are larger than $TR_{max}$, if the first alternative with an inverting, adiabatic preparation pulse 6 is not to be used or the third time interval 11 is to be adapted, optionally, therefore shown by a dashed line branch in FIG. 2, in a step S5 a non-adiabatic spectrally selective preparation pulse can also be described, as has been proposed for example in DE 10 2014 204 995 A1 cited above.

Then, in step S6, in any event there follows the time of the first output of the preparatory pulse 4 followed by the time of the first measurement sequence, wherein the steady state is already produced.

Then, in a step S7, a check is made as to whether all repetitions have already run, wherein, if this is not the case, the preparatory pulse 4 followed by the corresponding measurement is again employed in step S6. If magnetic resonance data has been recorded in all repetitions, the method ends in a step S8, in which for example a magnetic resonance image data set of the target area can be reconstructed.

It should also be noted that a spoiler gradient will be output after each of the preparation pulses 6, 8 and 9 in order to clear remaining transverse magnetizations by dephasing.

Figure 6:
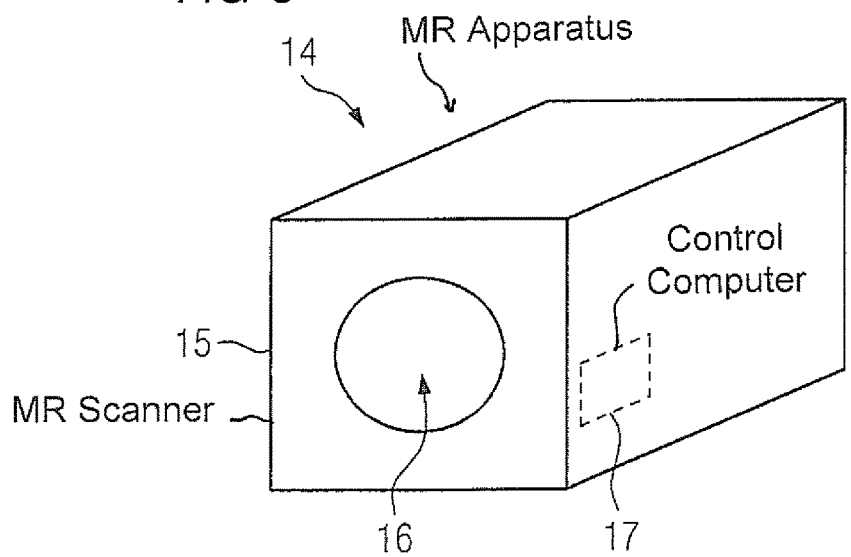
FIG. 6 shows an inventive magnetic resonance apparatus.

FIG. 6 shows a basic illustration of an inventive magnetic resonance apparatus 14. As is basically known, this has a data acquisition scanner 15 containing a basic field magnet that generates the basic magnetic field, in which, in the present example a cylindrical patient receiving area 16 is situated. A radio-frequency coil arrangement and a gradient coil arrangement, not shown here in greater detail, are provided in the scanner 15 surrounding the patient receiving area 16.

The operation of the magnetic resonance apparatus 14 is controlled by a control computer 17, which is also configured to implement the inventive method. For this purpose the control computer 17 has a sequence control controller, for controlling emission or activation of the different pulses of the magnetic resonance sequence, as well as the preparation pulses. The control computer 17 also has a preparation unit processor, in which the method of operation to be applied is selected and the time intervals (7 or 10, 11) of the respective time sequence are suitably chosen.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for recording magnetic resonance (MR) data, comprising:

in a computer, dividing a procedure for acquiring MR data from a target region of a subject into a plurality of successive procedure subsections, each having a same repetition time that starts at a beginning of each procedure subsection and ends at a beginning of a next-successive procedure subsection, each procedure subsection comprising a measurement sequence in which the MR data are acquired in that procedure subsection, each measurement sequence beginning with radiation of an excitation pulse;

from said computer, operating an MR data acquisition scanner in order to acquire said MR data by executing said procedure and, before the excitation pulse of each measurement sequence, activating an adiabatic preparatory pulse that inverts a longitudinal magnetization of a saturation molecule type in the subject from which no MR data are to be acquired, said excitation pulse following said adiabatic preparatory pulse by an inversion time;

from said computer, also operating said MR data acquisition scanner in said procedure by, before a first activation of said adiabatic preparatory pulse, activating at least one adiabatic preparation pulse that inverts said longitudinal magnetization, with a timing between said at least one adiabatic preparation pulse and said first adiabatic preparatory pulse causing said longitudinal magnetization to be at a steady state value at a time of activation of said first preparatory pulse, said steady state value again occurring after activation of each adiabatic preparatory pulse and before an end of each repetition time; and in said computer, compiling said MR data in a data file and making said data file available from said computer as an electronic output.

2. A method as claimed in claim 1 comprising, in said computer, determining said determining said timing between said at least one adiabatic preparation pulse and said adiabatic preparatory pulse by accessing a time interval from a look-up table or calculating a time interval from a functional mathematical relationship depending on a basic magnetic field strength in said scanner, a relaxation time of said saturation molecule, and said repetition time.

3. A method as claimed in claim 1 comprising activating a single adiabatic preparation pulse before said adiabatic preparatory pulse with a time interval therebetween that causes the steady state value of said longitudinal magnetization to occur at the time of activation of said adiabatic preparatory pulse.

4. A method as claimed in claim 1 comprising activating two adiabatic preparation pulses that are spaced from each other by a time interval, with said first adiabatic preparatory pulse following a second of said adiabatic preparation pulses by a further time interval, with said further time interval being selected so that, by relaxation of said longitudinal magnetization, a negative of an intermediate value of said longitudinal magnetization is produced, with said steady state value being reached by said relaxation during said further time interval, starting from said intermediate value, after activation of said second of said adiabatic preparation pulses.

5. A method as claimed in claim 1 comprising:
in said computer, identifying whether a predetermined region in the subject exists in which said MR data acquisition scanner can be operated in either of a first mode or a second mode;
said first mode comprising activating a single adiabatic preparation pulse before said adiabatic preparatory pulse with a time interval therebetween that causes the steady state value of said longitudinal magnetization to occur at the time of activation of said adiabatic preparatory pulse;
said second mode comprising activating two adiabatic preparation pulses that are spaced from each other by a time interval, with said first adiabatic preparatory pulse following a second of said adiabatic preparation pulses by a further time interval, with said further time interval being selected so that, by relaxation of said longitudinal magnetization, a negative of an intermediate value of said longitudinal magnetization is produced, with said steady state value being reached by said relaxation during said further time interval, starting from said intermediate value, after activation of said second of said adiabatic preparation pulses;
in said computer, selecting whether to operate said MR data acquisition scanner in said first mode or in said second mode in order to minimize an overall duration of said procedure.

6. A method as claimed in claim 5 comprising, outside of said predetermined area, operating said MR data acquisition scanner in order to execute said procedure using a non-adiabatic, spectrally selective preparation pulse instead of said at least one adiabatic preparation pulse.

7. A method as claimed in claim 1 comprising, from said computer, operating said MR data acquisition scanner in said procedure to activate a spoiler gradient pulse, after each adiabatic preparation pulse, that clears any remaining transverse magnetization in said subject.

8. A method as claimed in claim 1 comprising, from said computer, operating said MR data acquisition scanner in said procedure to activate each preparatory pulse and said at least one preparation pulse as SPAIR pulses.

9. A method as claimed in claim 1 wherein said saturation molecule type is fat molecules.

10. A magnetic resonance (MR) apparatus comprising:
an MR data acquisition scanner;
a computer configured to divide a procedure for acquiring MR data from a target region of a subject into a plurality of successive procedure subsections, each having a same repetition time that starts at a beginning of each procedure subsection and ends at a beginning of a next-successive procedure subsection, each procedure subsection comprising a measurement sequence in which the MR data are acquired in that procedure subsection, each measurement sequence beginning with radiation of an excitation pulse;
said computer being configured to operate said MR data acquisition scanner in order to acquire said MR data by executing said procedure and, before the excitation pulse of each measurement sequence, to activate an adiabatic preparatory pulse that inverts a longitudinal magnetization of a saturation molecule type in the subject from which no MR data are to be acquired, said excitation pulse following said adiabatic preparatory pulse by an inversion time;
said computer being configured to also operate said MR data acquisition scanner in said procedure by, before a first activation of said adiabatic preparatory pulse, activating at least one adiabatic preparation pulse that inverts said longitudinal magnetization, with a timing between said at least one adiabatic preparation pulse and said first adiabatic preparatory pulse causing said longitudinal magnetization to be at a steady state value at a time of activation of said first preparatory pulse, said steady state value again occurring after activation of each adiabatic preparatory pulse and before an end of each repetition time; and
said computer being configured to compile said MR data in a data file and make said data file available from said computer as an electronic output.

11. A non-transitory, computer-readable data storage medium encoded with programming instructions, said storage medium being loaded into a computer system of a magnetic resonance (MR) apparatus that comprises an MR data acquisition scanner, said programming instructions causing said computer system to:
divide a procedure for acquiring MR data from a target region of a subject into a plurality of successive procedure subsections, each having a same repetition time that starts at a beginning of each procedure subsection and ends at a beginning of a next-successive procedure subsection, each procedure subsection comprising a measurement sequence in which the MR data are acquired in that procedure subsection, each measurement sequence beginning with radiation of an excitation pulse;

operate said MR data acquisition scanner in order to acquire said MR data by executing said procedure and, before the excitation pulse of each measurement sequence, activating an adiabatic preparatory pulse that inverts a longitudinal magnetization of a saturation molecule type in the subject from which no MR data are to be acquired, said excitation pulse following said adiabatic preparatory pulse by an inversion time;

also operate said MR data acquisition scanner in said procedure by, before a first activation of said adiabatic preparatory pulse, activating at least one adiabatic preparation pulse that inverts said longitudinal magnetization, with a timing between said at least one adiabatic preparation pulse and said first adiabatic preparatory pulse causing said longitudinal magnetization to be at a steady state value at a time of activation of said first preparatory pulse, said steady state value again occurring after activation of each adiabatic preparatory pulse and before an end of each repetition time; and compile said MR data in a data file and make said data file available from said computer system as an electronic output.

* * * * *